United States Patent
Sancheti et al.

(10) Patent No.: US 7,019,576 B1
(45) Date of Patent: Mar. 28, 2006

(54) DELAY CIRCUIT THAT SCALES WITH CLOCK CYCLE TIME

(75) Inventors: Sanjay K. Sancheti, Starkville, MS (US); Suwei Chen, Mississippi State, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/804,988

(22) Filed: Mar. 18, 2004

Related U.S. Application Data

(60) Provisional application No. 60/457,525, filed on Mar. 24, 2003.

(51) Int. Cl.
*H03H 11/26* (2006.01)

(52) U.S. Cl. ...................... 327/261; 327/285
(58) Field of Classification Search ............... 327/261, 327/263, 264, 276, 277, 278, 284, 285, 290
See application file for complete search history.

(56) References Cited

U.S. PATENT DOCUMENTS

| | | | | |
|---|---|---|---|---|
| 5,610,546 | A | * | 3/1997 | Carbou et al. ............. 327/261 |
| 5,767,719 | A | * | 6/1998 | Furuchi et al. ............. 327/281 |
| 6,043,717 | A | | 3/2000 | Kurd ............................ 331/17 |
| 6,100,739 | A | | 8/2000 | Ansel et al. ................ 327/175 |
| 6,175,928 | B1 | | 1/2001 | Liu et al. .................... 713/401 |
| 6,327,318 | B1 | | 12/2001 | Bhullar et al. ............. 375/374 |
| 6,445,238 | B1 | | 9/2002 | Lesea .......................... 327/262 |
| 6,455,661 | B1 | | 9/2002 | Wu ............................ 369/59.2 |
| 6,819,157 | B1 | | 11/2004 | Cao et al. .................... 327/262 |

FOREIGN PATENT DOCUMENTS

JP     404227314     8/1992

* cited by examiner

*Primary Examiner*—Linh My Nguyen

(57) ABSTRACT

A circuit having a process, voltage, and temperature (PVT) invariant delay element is disclosed. In one embodiment, the present invention includes a first and second operational transconductance amplifier (OTA), a first and second switched capacitor driven by a clock, and a first and second clock-controlled switch. In addition, the present invention includes a trip inverter, a delay inverter, and a plurality of transistors. In so coupling the first and second OTA, the first and second switched capacitor, the first and second clock-controlled switch, the trip inverter, the delay inverter, and the plurality of transistors, a circuit having a PVT invariant delay element is provided.

20 Claims, 4 Drawing Sheets

BACKGROUND

US 7,019,576 B1

DELAY CIRCUIT THAT SCALES WITH CLOCK CYCLE TIME

RELATED U.S. APPLICATION

This application claims priority to the provisional patent application, Ser. No. 60/457,525, entitled "A Switched Capacitor Delay Element with Minimum Delay Variation Across PVT," with filing date Mar. 24, 2003 now abandoned, and assigned to the assignee of the present application. This application is hereby incorporated by reference.

FIELD OF THE INVENTION

The present invention relates generally to electronic circuitry and in particular to circuits having PVT invariant delays.

BACKGROUND OF THE INVENTION

Delay element circuits are widely used in analog and digital electronic circuitry. The purpose of such a circuit is to take an input signal, to delay it for a period of time, and to then pass the signal to an output circuit. Delay element circuits may be used to adjust the setup ($t_s$) and hold ($t_h$) times of signals entering a circuit, or to adjust the clock to output time (sometimes referred to as $t_{CO}$ or $t_{CQ}$) of signals leaving a circuit. Delay elements may also be used to adjust the timing of clock and data signals output from electronic devices, such as memory devices.

An embodiment of a conventional delay element circuit is shown in FIG. 1. This circuit 100 includes a first operational transconductance amplifier (OTA) 110, commonly referred to as an 'op-amp', and second OTA 115. This circuit 100 further includes a first resistor 120, a second resistor 125, a trip inverter 130, a delay inverter 135, and a first (M1), second (M2), third (M3), fourth (M4), fifth (M5), and sixth (M6) transistor. In the exemplary embodiment of FIG. 1, the second (M2), fifth (M5), and sixth (M6) transistors include NMOS transistors, and the first (M1), third (M3), and fourth (M4) transistors include PMOS transistors.

The delay element of the conventional implementation 100 includes the path from the input marked 'in 140', through the fourth (M4) and fifth (M5) transistors and through the delay inverter 135 to the output 150. The propagation delay time (Tpd) of a falling edge through this circuit is given by the following equation (1), where Cin 155 is the input capacitance of the delay inverter 135 as shown in FIG. 1, m is the multiplier of the transistor size (e.g., m=M3/M1), R is the value of the resistor, and vtrip is the trip voltage for the inverter:

$$Tpd \text{ (of a falling edge)} = Cin * (vtrip - 0) / m * Ip \quad (1)$$
$$= Cin * (vtrip) / m * (vtrip\_p / R)$$
$$= Cin * R / m \text{ (since } vtrip \sim vtrip\_p).$$

The delay of a rising edge through this circuit is given by equation (2):

$$Tpd \text{ (of a rising edge)} = Cin * (vdd - vtrip) / m * In \quad (2)$$
$$= Cin * (vdd - vtrip) / m * (vdd - vtrip\_n) / R$$
$$= Cin * R / m \text{ (since } vtrip \sim vtrip\_n).$$

The delay is a product of the first resistor 120 and the second resistor 125 values, marked 'R', and the input capacitance 155 of the delay inverter 135 as shown in FIG. 1. These resistor and capacitor values are fixed, and are typically chosen in the design phase to match the desired operating frequency of the circuit. However, these resistor and capacitor values will vary with process, voltage, and temperature (PVT), and as a result, the delay of circuit 100 will vary in response to PVT variations.

In one exemplary embodiment, simulations of this circuit show a plus or minus 37 percent variation in delay across PVT. A disadvantage of this conventional circuit 100 is that the wide variation in propagation delay across PVT may cause improper operation of the application. A further disadvantage of this conventional circuit 100 is that the propagation delay of this element (which depends only on the resistance and input capacitance values of the circuit), once designed, does not readily adjust in proportion to an input signal.

SUMMARY OF INVENTION

Thus, a need exists for a circuit having a delay element that does not vary with PVT variations. The circuit may have a propagation delay that does not depend on a fixed resistor value, but rather has a propagation delay as a function of a capacitance ratio that can be controlled very accurately across PVT variations. A further need exists for a delay element that is scalable according to an input clock cycle. Still another need exists for a delay element which is compatible with existing manufacturing and operating processes. Embodiments of the present invention provide these advantages.

A circuit having a process, voltage, and temperature (PVT) invariant delay element is disclosed. In one embodiment, the present invention includes a first and second operational transconductance amplifier (OTA), a first and second switched capacitor driven by an input clock, and a first and second clock-controlled switch. In addition, embodiments of the present invention include a trip inverter, a delay inverter, and a plurality of transistors. In so coupling the first and second OTA, the first and second switched capacitor, the first and second clock-controlled switch, the trip inverter, the delay inverter, and the plurality of transistors, a circuit having a PVT invariant delay element is provided.

The resultant propagation delay of the circuit is based on a ratio of capacitance values, specifically the switched capacitor and the input capacitance. The ratio is invariant to variations in PVT. Moreover, the propagation delay is proportional to the cycle of time of the input clock which controls the switched capacitor.

An embodiment of the present invention further provides a method for implementing a delay element with a low variation across process, voltage, and temperature (PVT) into a circuit. In one embodiment, a switched capacitor is provided in a delay element circuit. In addition, a hold capacitor is utilized to maintain a trip voltage to the switched capacitor, wherein the ratio of the switched capacitor capacitance and the input capacitance has lower variation across process, voltage, and temperature changes than an equivalent resistor in the delay element circuit.

In its various embodiments, the present invention provides a circuit having a process, voltage, and temperature (PVT) invariant delay element. The present invention also provides a circuit having a delay element wherein the propagation delay does not depend on a fixed resistor value, but where the propagation delay is a function of a capacitance ratio which can be controlled accurately across PVT variations. The present invention further provides a circuit having a PVT invariant delay element which is scalable according to the input clock cycle. The present invention additionally provides a circuit having a PVT invariant delay element which achieves the above accomplishments and which readily interfaces with industry standard components and meets industry standard specifications.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Figure 1:
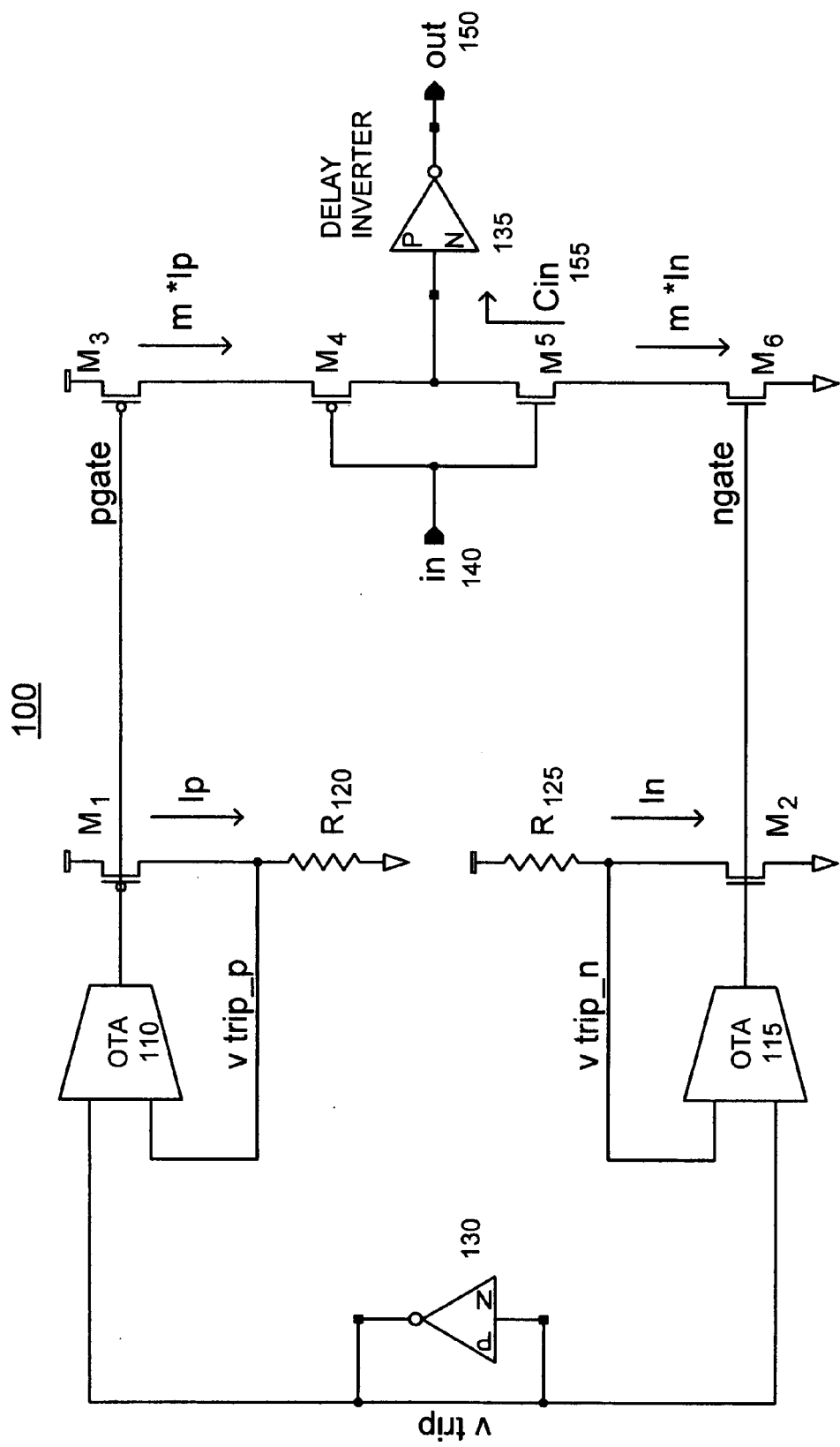
FIG. 1 is a circuit for a conventional delay element.
Figure 2:
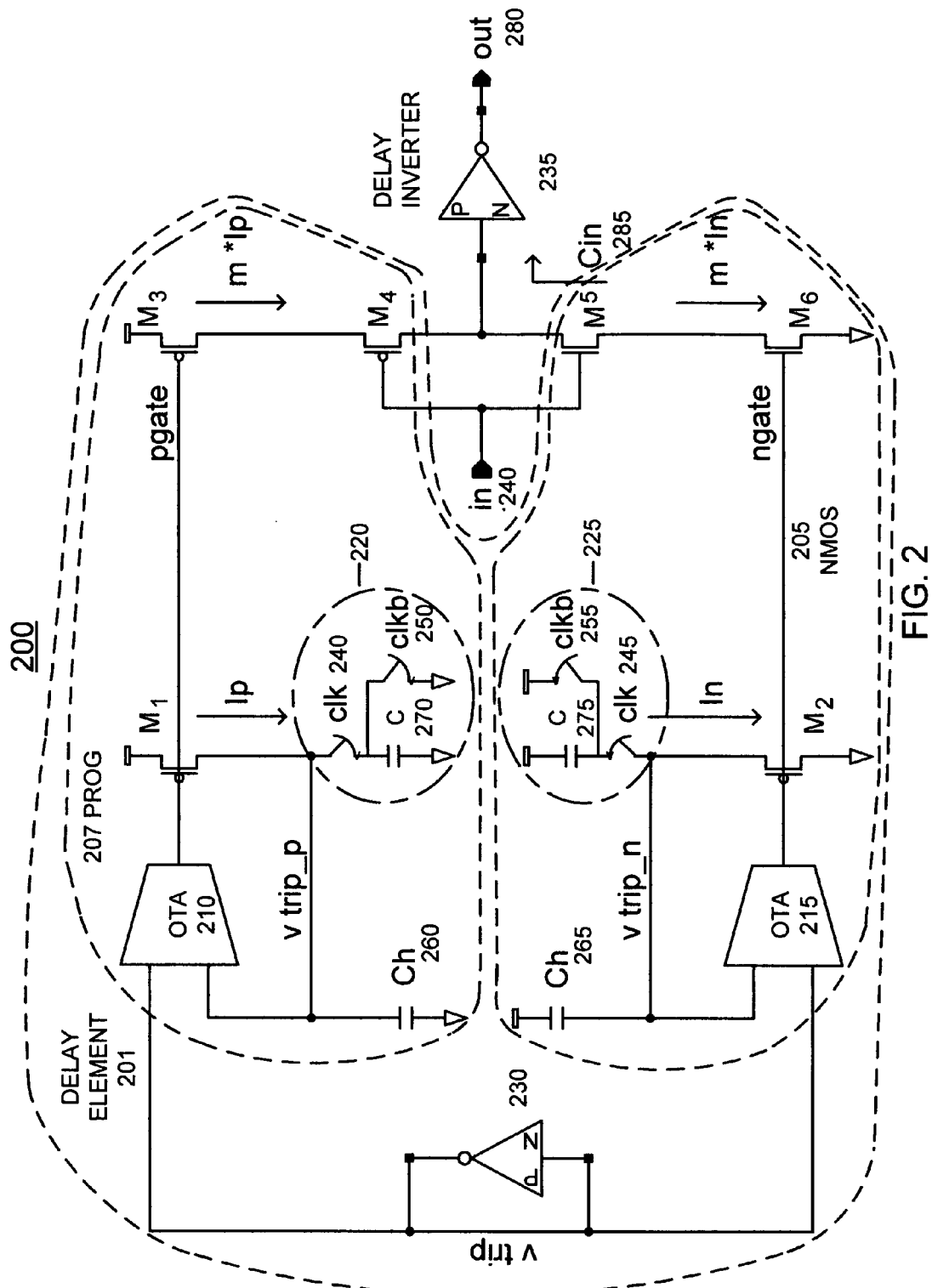
FIG. 2 is a circuit for the improved delay element in accordance with an embodiment of the present invention having a propagation delay that is invariant to PVT variations and scalable to an input.

With reference now to FIG. 2, an embodiment of a circuit 200 having a process, voltage, and temperature (PVT) invariant delay element is shown. The propagation delay is also scalable with reference to an input clock cycle time. Delay element circuit 200 includes a first operational trans conductance amplifier (OTA) 210 and a second OTA 215. Delay element circuit 200 further includes a first hold capacitor (Ch) 260, a second Ch 265, a first switched capacitor 220, a second switched capacitor 225, a first clock-controlled switch 240, a second clock-controlled switch 245, a first clockbar-controlled switch 250, a second clockbar-controlled switch 255, a trip inverter 230, a delay inverter 235, and a first (M1), second (M2), third (M3), fourth (M4), fifth (M5), and sixth (M6) transistor. In the exemplary embodiment of FIG. 2, the second (M2), fifth (M5), and sixth (M6) transistors include NMOS transistors, and the first (M1), third (M3) and fourth (M4) transistors include PMOS transistors.

In one embodiment, circuit 200 includes a delay element 201 having a first switching leg 205 including a first switched capacitor 225 and a second switching leg 207 having a second switched capacitor 220. An input signal switching leg 240 is coupled with the delay element 201 and a delay inverter 235 is coupled with the delay element 210, such that a propagation delay of the delay element 201 is a function of a switch capacitance of the first switched capacitor 225 and the second switched capacitor 220 and an input capacitance 285. Delay element 201 also includes a trip inverter 230 coupled with the first switching leg 205 and the second switching leg 207 to supply the vtrip to the delay element 201.

First switching leg 205 includes a first operational transconductance amplifier (OTA) 215 coupled with the trip inverter 230 and a NMOS transistor M2. In addition, a first hold capacitor 265 is coupled with the first OTA 215 and the first switched capacitor 225 and supplies a voltage to the first switched capacitor 225 since no resistor is present. Second switching leg 207 includes a second OTA 210 coupled with the trip inverter 230 and a PMOS transistor M1. In addition, a second hold capacitor 260 is coupled with the second OTA 210 and the second switched capacitor 220 and supplies a voltage to the second switched capacitor 220 since no resistor is present.

The delay element circuit 200 includes the path from the input marked 'in' 240, through the fourth (M4), and fifth (M5) transistors and through the delay inverter 235 to the output 280. In an alternative embodiment, any logic gate or other delay element could be used as a propagation delay with this circuit. The hold capacitors 260 and 265 are relatively large and their purpose is to hold the nodes marked 'vtrip-n' and 'vtrip-p' at a reference value. In an alternative embodiment, the hold capacitors 260 and 265 could be replaced by another capacitance in parallel with the switched capacitor, controlled by a complimentary clock to that of the switched cap.

Figure 3:
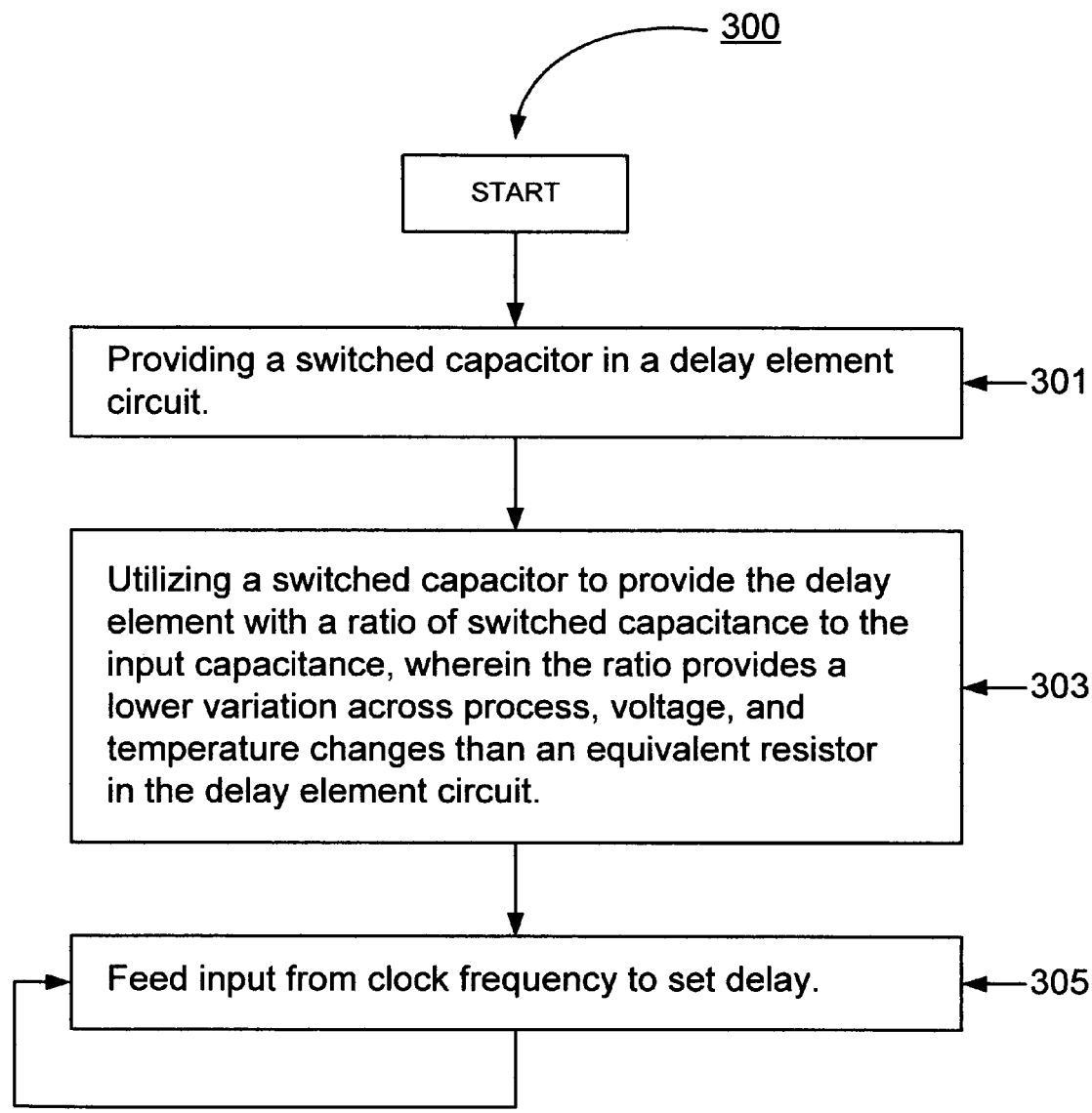
FIG. 3 is a flowchart of the steps for utilizing a delay element with a low variation across PVT into a circuit in accordance with an embodiment of the present invention.

With reference now to FIG. 3, a flowchart of the steps for utilizing a delay element with a low variation across PVT into a circuit is shown in accordance with an embodiment of the present invention.

With reference now to step 301 of FIG. 3 and to FIG. 2, in one embodiment, a switched capacitor is provided in a delay element. A switched capacitor is simply a circuit having a capacitor and two switches which are controlled with clock and clock-bar. By utilizing a switched capacitor (e.g., 220 and 225) instead of a resistor, the dependency of the delay element on the resistor is removed. Instead, the propagation delay in the delay element circuit 200 becomes a function of a capacitance ratio instead of a single absolute capacitance and can thus be controlled very accurately over PVT because variations are cancelled out. Moreover, due to the clock and clock-bar inputs to the switched capacitors (e.g., 220 and 225), the propagation delay of delay element circuit 200 is directly proportional to cycle time of the input clock. That is, a change in clock frequency causes a change in the propagation delay applied by delay element circuit 200 to the clock.

Delay element circuit 200 replaces the resistors of the conventional circuit with a switched capacitor (e.g., 220 and 225) of equivalent resistance, given by the equation:

$R$ (equivalent)=1/(Frequency of switching clock*Capacitance of switched capacitor).

Therefore, the propagation delay of a falling edge through circuit 200 (e.g., from start of signal fall until the circuit switches) is given by the following equation (3):

$$Tpd \text{ (of a falling edge)} = Cin * (vtrip - 0)/m * Ip \qquad (3)$$
$$= Cin * (vtrip)/(m * (\text{vtrip\_p}/Req))$$
$$= Cin * Req/m \text{ (since } vtrip \sim \text{vtrip\_p})$$
$$= (Tcyc/m) * (Cin/C).$$

The propagation delay of arising edge through this circuit (e.g., from start of signal low through rise to switch point) is given by equation (4):

$$Tpd \text{ (of a rising edge)} = Cin * (vdd - vtrip)/m * In \qquad (4)$$
$$= Cin * (vdd - vtrip)/(m * (vdd - \text{vtrip\_n})/Req)$$
$$= Cin * Req/m \text{ (since } vtrip \sim \text{vtrip\_n})$$
$$= (Tcyc/m) * (Cin/C).$$

Where the 'm' value in the above equation is the multiplication factor (size) of a transistor (e.g., m=M3/M1=M6/M2), Cin is the input capacitance 285, and vtrip is the trip voltage for the inverter.

From these relationships, it can be seen that in the improved embodiment, the propagation delay through the circuit for the rising and falling edges is a function of the ratio of the input capacitance (Cin) 285 to the switched capacitance (C). Because this ratio will stay relatively constant, regardless of variations in PVT, the propagation delay variation is significantly less than in the conventional circuit. In one exemplary embodiment, simulation results show a propagation delay variation of just plus or minus 12 percent in the circuit, when compared to a propagation delay variation of plus or minus 37 percent for the conventional circuit with respect to PVT variations. This is an advantage of the delay element circuit 200. Further advantages of the delay element circuit 200 include the fact that dependency of propagation delay on a resistor value is eliminated, and the fact that the propagation delay of this element scales according to clock cycle and transistor size.

Referring now to step 303 of FIG. 3 and FIG. 2, in one embodiment, a switched capacitor is utilized to provide the delay element with a ratio of switched capacitance to the input capacitance 285 wherein the ratio provides a lower variation across process, voltage, and temperature changes than an equivalent resistor in the delay element circuit. That is, as stated herein, the propagation delay is no longer a product of resistance and capacitance and therefore PVT variations with respect to the resistors are removed. Moreover, the absolute capacitance is replaced with a ratio of capacitance which can easily be controlled. Thus, the addition of a clock and clock-bar switch allows frequency of the clock signal to become an additional factor. In operation, vtrip is a standard voltage used to set the reference for tripping the inverter and is forced onto the OTA nodes (e.g., 210 and 215) by the inverter 230.

Figure 4:
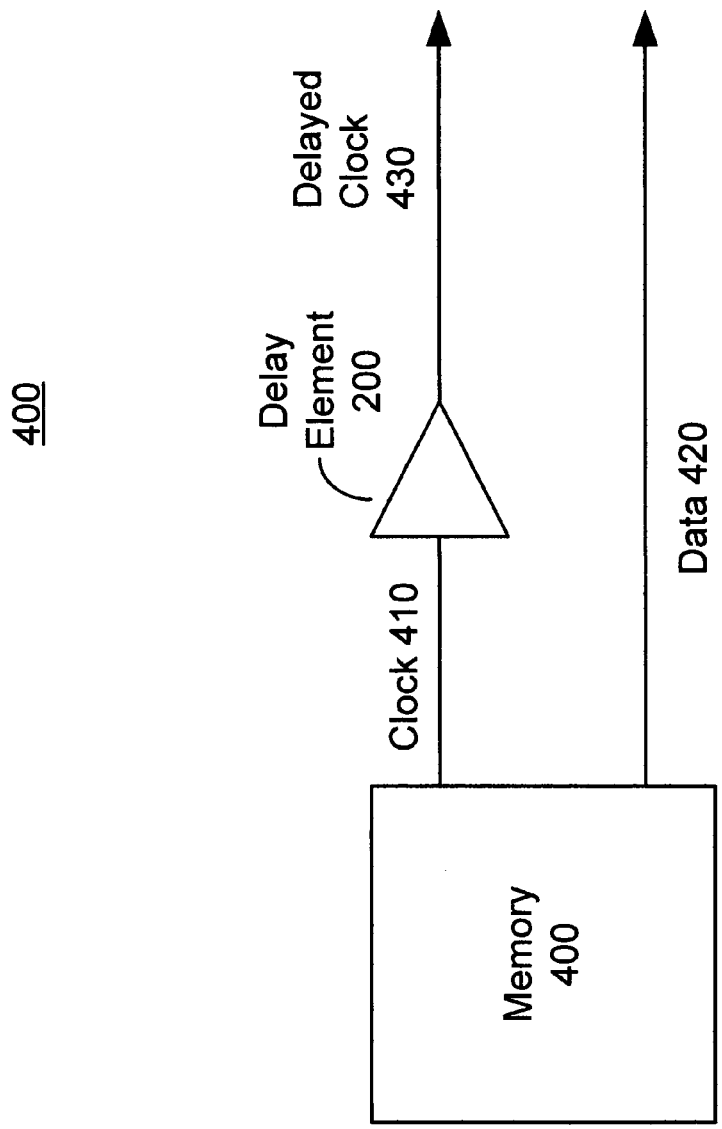
FIG. 4 is a block diagram of an exemplary memory device using a delay element to adjust clock and data output in accordance with an embodiment of the present invention.

With reference now to FIG. 4, a block diagram of an exemplary memory device using a delay element to adjust clock and data output is shown in accordance with an embodiment of the present invention. In one embodiment, the delay element circuit 200 utilizes the same reference clock 410 as the reference clock used by the data-providing device (e.g., a memory device 400). In operation, the delay element circuit 200 is used to provide a propagation delay to the clock signal (e.g., delayed clock 430) not the data 420. That is, the clock 410 goes through the delay element circuit 200 and the clock is delayed the preset amount (e.g., delayed clock 430), but the data 420 bypasses the delay element circuit 200. For example, a downstream device such as a latch, manipulates data output between two transitions (e.g., clock signals). As is well known, the margin before the clock edge is set-up time and after that, it is hold time. The delay element circuit 200 allows a user to adjust the position of the clock edge within that window. By delaying the clock 430 with respect to the data 420, any skew between the data 420 and the clock edge 410 can be removed. For example, if there is more propagation delay in the data 420 path than in the clock 410 the delay element circuit 200 is applied to re-sink the clock path (e.g., delayed clock 430) versus the data 420 path.

In another embodiment, the delay element circuit 200 may be used to over-delay the clock path 430 versus the data 420. For example, the clock 410 may be delayed to conform to the setup and hold requirements of downstream devices such as a latch. In yet another embodiment, external control pins may be accessible to provide a user with the ability to skew the clock 410 versus the data 420 to meet the setup and hold requirements of the downstream device.

With reference now to step 305 of FIG. 3 and FIG. 2, in one embodiment, the feed input from the clock frequency is used to set the propagation delay. That is, not only is the propagation delay of the delay element circuit 200 controllable during manufacture, it is also adjustable when used in an operational circuit. That is, the capacitance ratio used in the manufacturing process provides a first static propagation delay variable, and the clock frequency used in operation provides a second dynamic propagation delay variable. Due to the plurality of propagation delay variables, the delay element circuit 200 may be adjusted to provide any percentage of offset to the clock. For example, the delay element circuit 200 may offset the clock by 25, 50, 75, or any other percentage desired by the user. Furthermore, the delay element circuit 200 may be used as a propagation delay in place of a phase lock loop (PLL) or delay lock loop (DLL) circuit hereby providing additional to both manufacturer and consumer while also simplifying the overall circuit.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Thus, the present invention provides, in various embodiments, a circuit having a process, voltage, and temperature (PVT) invariant delay element. Embodiments of the present invention also provide a circuit having a delay element wherein the propagation delay does not depend on a fixed resistor value, but where the propagation delay is a function of a capacitance ratio which can be controlled accurately across PVT. The present invention further provides a circuit having a PVT invariant delay element which is scalable according to the input clock cycle. The present invention additionally provides a circuit having a PVT invariant delay element which achieves the above accomplishments and which readily interfaces with industry standard components and meets industry standard specifications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A delay circuit comprising:
  a delay element comprising:
    a first switching leg comprising a first switched capacitor receiving a clock signal; and
    a second switching leg comprising a second switched capacitor receiving a clock signal;
  an input signal switching leg coupled with said delay element, said input signal switching leg providing a signal input to said delay element; and
  a delay inverter coupled with said delay element, wherein a propagation delay of said delay circuit is a function of a ratio between a switched capacitance of said delay element and an input capacitance to said delay inverter.

2. The circuit of claim 1 wherein said first switching leg is a negative channel metal-oxide semiconductor (NMOS) switching leg.

3. The circuit of claim 1 wherein said second switching leg is a positive channel metal-oxide semiconductor (PMOS) switching leg.

4. The circuit of claim 1 wherein said delay element further comprises a trip inverter coupled with said first switching leg and said second switching leg.

5. The circuit of claim 4 wherein said first switching leg further comprises:
  a first operational transconductance amplifier (OTA) coupled with said trip inverter and a NMOS transistor; and
  a first hold capacitor coupled with said first OTA and said first switched capacitor for supplying voltage to said first switched capacitor.

6. The circuit of claim 4 wherein said second switching leg further comprises:
  a second operational transconductance amplifier (OTA) coupled with said trip inverter and a PMOS transistor; and
  a second hold capacitor coupled with said second OTA and said second switched capacitor for supplying voltage to said second switched capacitor.

7. The circuit of claim 1 wherein said first and second switched capacitors further comprise a first and second clock-controlled switch for driving said switched capacitor.

8. The circuit of claim 7 wherein the propagation delay of the delay circuit is proportional to the clock signal frequency.

9. A delay circuit comprising:
  a delay element comprising:
    a negative channel metal-oxide semiconductor (NMOS) switching leg comprising a first switched capacitor receiving a clock signal; and
    a positive channel metal-oxide semiconductor (PMOS) switching leg comprising a second switched capacitor receiving a clock signal;
  an input signal switching leg coupled with an input of said delay element; and
  a delay inverter coupled with an output from said delay element, wherein a propagation delay of said delay circuit is proportional to said clock signal frequency.

10. The circuit of claim 9 wherein said delay element further comprises a trip inverter having a trip voltage coupled with said NMOS switching leg and said PMOS switching leg.

11. The circuit of claim 10 wherein said NMOS switching leg further comprises:
  a first operational transconductance amplifier (OTA) coupled with said trip inverter and a first NMOS transistor;
  a first hold capacitor coupled with said first OTA and said first switched capacitor;
  a second NMOS transistor coupled with a source and said switched capacitor; and
  a third NMOS transistor coupled with said first NMOS transistor and said input signal switching leg.

12. The circuit of claim 10 wherein said PMOS switching leg further comprises:
  a second operational transconductance amplifier (OTA) coupled with said trip inverter and a first PMOS transistor; and
  a second hold capacitor coupled with said second OTA and said second switched capacitor for supplying voltage to said second switched capacitor;
  a second PMOS transistor coupled with a source and said switched capacitor; and
  a third PMOS transistor coupled with said first PMOS transistor and said input signal switching leg.

13. The circuit of claim 9 wherein the propagation delay of the delay circuit is a function of a ratio of an input capacitance and a switched capacitance.

14. The circuit of claim 9 wherein the propagation delay of the delay element is scaleable with respect to the frequency of the clock signal using an external control pin.

15. A memory system for delaying a clock signal with respect to a data clock signal comprising:
  a memory element for outputting data in conjunction with a clock signal; and
  a delay circuit utilizing a switched capacitor to provide a propagation delay, wherein the delay element skews the clock signal versus data output from said memory element, and wherein the propagation delay of said delay circuit is a function of a ratio of an input capacitance and a switched capacitance.

16. The memory system of claim 15 wherein the propagation delay of said delay circuit is proportional to a frequency of said clock signal.

17. The memory system of claim 15 wherein the clock signal goes through the delay circuit and the data output does not go through the delay circuit.

18. The memory system of claim 15 wherein said delay circuit comprises:
- a negative channel metal-oxide semiconductor (NMOS) switching leg comprising:
  - a first operational transconductance amplifier (OTA) coupled with a trip inverter and a first NMOS transistor;
  - a first hold capacitor coupled with said first OTA and said first switched capacitor;
  - a second NMOS transistor coupled with a source and said switched capacitor; and
  - a third NMOS transistor coupled with said first NMOS transistor and an input signal; and
- a positive channel metal-oxide semiconductor (PMOS) switching leg comprising:
  - a second operational transconductance amplifier (OTA) coupled with said trip inverter and a first PMOS transistor; and
  - a second hold capacitor coupled with said second OTA and said second switched capacitor for supplying voltage to said second switched capacitor;
  - a second PMOS transistor coupled with a source and said switched capacitor; and
  - a third PMOS transistor coupled with said first PMOS transistor and said input signal.

19. The memory system of claim 18 wherein the propagation delay of the delay circuit can be controlled by adjusting a ratio of a channel width of said NMOS transistors.

20. The memory system of claim 18 wherein the propagation delay of the delay circuit can be controlled by adjusting a ratio of a channel width of said PMOS transistors.

* * * * *